United States Patent [19]

Gulett et al.

[11] 4,330,569

[45] May 18, 1982

[54] METHOD FOR CONDITIONING NITRIDE SURFACE

[75] Inventors: Michael R. Gulett, Oceanside, Calif.; Murray L. Trudel, Centerville; John K. Stewart, Jr., West Carrollton, both of Ohio

[73] Assignee: NCR Corporation, Dayton, Ohio

[21] Appl. No.: 195,806

[22] Filed: Oct. 10, 1980

Related U.S. Application Data

[63] Continuation of Ser. No. 42,476, May 25, 1979, abandoned, which is a continuation of Ser. No. 886,851, Mar. 15, 1978, abandoned, which is a continuation of Ser. No. 784,881, Apr. 5, 1977, abandoned.

[51] Int. Cl.³ ............................................. B05D 3/06
[52] U.S. Cl. ...................................... 427/38; 427/94; 427/346
[58] Field of Search ................... 427/94, 38, 34, 82, 427/346

[56] References Cited

U.S. PATENT DOCUMENTS 3,549,368 12/1970 Collins et al. .................. 430/272
3,687,722 8/1972 Saxena ............................ 427/38

OTHER PUBLICATIONS

Erez et al., "Pattern Etching Fotoceramic or Sputtered SiO₂", IBM Tech. Disc. Bull., vol. 16, No. 8, Jan. 1974, p. 2755.

Primary Examiner—Bernard D. Pianalto
Attorney, Agent, or Firm—J. T. Cavender

[57] ABSTRACT

A method of conditioning a nitride surface by treating it with ionized oxygen is disclosed. The nitride surface is placed in a vacuum and treated with the ionized oxygen for a period of time sufficient to condition the nitride for subsequent processing steps. The ionized oxygen treatment is performed substantially at ambient temperature. The conditioning method is included in a process for improving the adhesion characteristics of a photoresist film to a silicon nitride surface. A liquid solution of hexamethyldisilazane is applied to the conditioned nitride surface. Thereafter, a photoresist is applied, exposed through a photographic mask and developed in a known manner for the purpose of forming a photoresist masking film pattern. The photoresist film pattern typically serves as a mask during an etching process in which areas not covered by photoresist are removed by a suitable etching solution.

3 Claims, 6 Drawing Figures

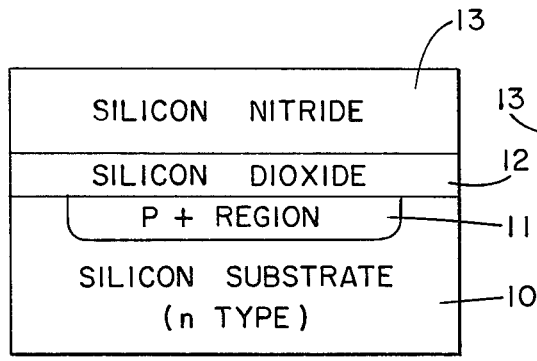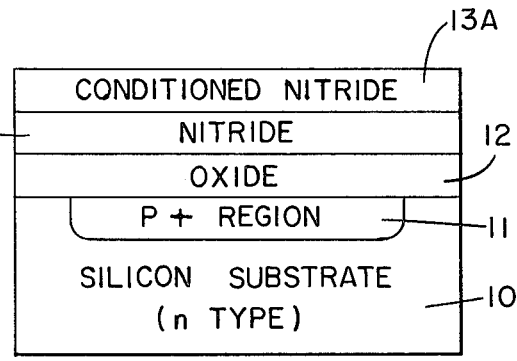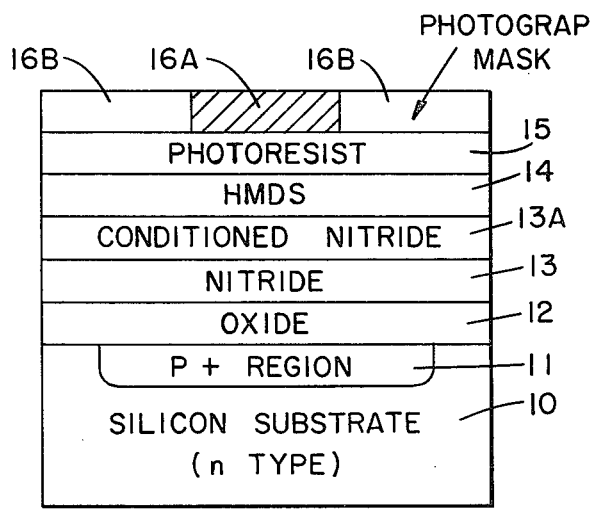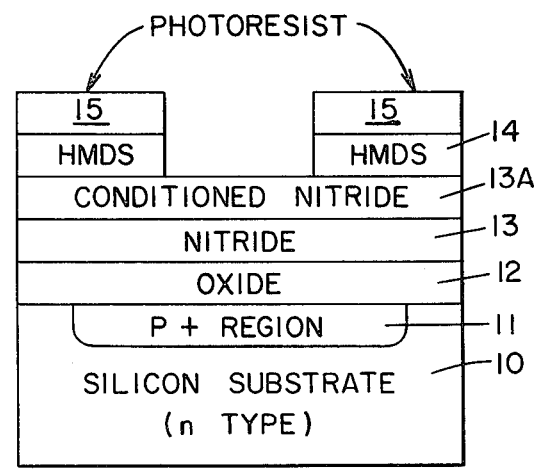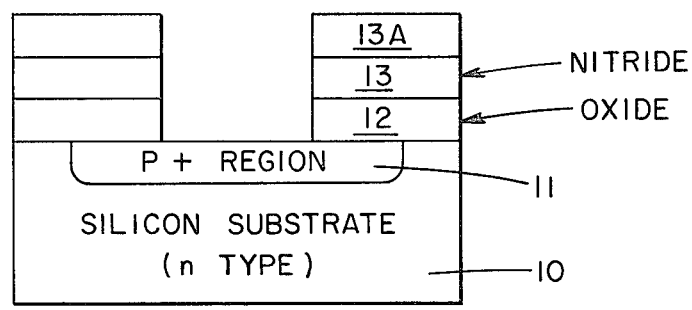

METHOD FOR CONDITIONING NITRIDE SURFACE

This is a continuation of application Ser. No. 42,476, filed May 25, 1979, abandoned which is a continuation of application Ser. No. 886,851, filed Mar. 15, 1978, which is a continuation of application Ser. No. 784,881, filed Apr. 5, 1977.

BACKGROUND OF THE INVENTION (1) Field of the Invention

This invention relates to the processing of nitride surfaces during the production of semiconductor devices. More particularly, the invention relates to a method of conditioning a semiconductor wafer including a deposited silicon nitride layer for subsequent processing steps. It is specifically useful in conditioning the surface of a nitride layer for subsequent application of photoresistive materials used for enabling the selective etching away of portions of the nitride layer.

The invention is particularly useful in fabricating metal-nitride-oxide silicon (MNOS) and silicon gate (SG) semiconductor devices. During fabrication of both types of devices, silicon nitride layers are deposited on a semiconductor wafer at some point at the wafer processing sequence. For various reasons, later in the processing sequence it becomes necessary to remove selected portions of the nitride layer by a masking and etching operation. For example, in a typical SG process a semiconductor wafer substrate is provided first with a thin oxide layer followed by a nitride layer; and then the nitride layer is selectively removed only in the field regions of the substrate so that an ion implant of the field region through the oxide layer can be performed. Later in this SG processing sequence the nitride layer and underlying oxide layer are removed from the gate region of the substrate so that a gate oxide can be grown on the substrate and the gate region implanted through the gate oxide.

In a typical MNOS process a silicon nitride layer is deposited over a gate oxide layer grown on a semiconductor substrate. Later, the nitride layer and the gate oxide layer are removed from previously defined contact apertures in a field oxide region so that metal can be deposited to contact the semiconductor substrate wherein source, drain, and other contact regions have been formed earlier in the process. Removal of selected portions of grown or deposited layers on a semiconductor wafer is typically accomplished by a photoresist-wet chemical etching procedure. This procedure requires good adherence of the final photoresist etchant mask to the underlying layer during etching to produce high resolution, well defined and controlled topology in the resultant structure and consistent high yields at these important steps in the wafer processing procedure.

(2) Description of the Prior Art

A standard well-known technique for producing a high quality etchant mask pattern on a silicon nitride layer involves the steps of (1) forming a thin masking oxide layer on the nitride surface, (2) densifying the oxide layer, (3) employing standard photomask photoresist techniques to form a photoresist etchant mask pattern on the masking oxide layer, and (4) etching the oxide layer, typically using buffered hydrofluoric acid, to produce an oxide etchant mask pattern on the surface of the nitride layer. Then, an etching solution which attacks only the nitride and not the oxide layer is employed to remove the nitride layer in exposed areas. This prior art method produces adequate results. Nevertheless, additional handling and the increased processing time appreciably raises manufacturing costs. For example, at least ½ hour in a chemical vapor deposition reactor is required to deposit on a silicon nitride layer a masking oxide layer that is sufficiently thick to accomplish the desired result. Further, at least an additional hour of processing time is required to densify the masking oxide for it to function adequately as an etchant mask. Finally, if an oxide layer under the nitride layer must also be removed as in several examples given above, a separate oxide etch must be employed after the selective nitride etch. These additional processing steps also complicate the overall process.

The reason for the use of the masking oxide is that photoresistive materials adhere very poorly when applied directly to a nitride surface. Poor photoresist adhesion results in loss of the required high resolution photoresist etchant mask pattern while the nitride layer is subjected to the etching solution. Consequently, the ability to produce sharply defined and closely controlled nitride layer topology is seriously degraded.

It has previously been proposed to apply a heated solution of trichlorophenylsilane to a nitride surface to improve the adhesion of photoresist applied thereafter to the coated nitride surface. (See Michael R. Gulett application. "Improved Semiconductor Processing", U.S. Ser. No. 668,167, filed Mar. 18, 1976). Other organosilane solutions such as hexalkyldisilazane solutions and, in particular, hexamethyldisilazane, have also been found to improve somewhat the adhesion of photoresist to silicon nitride. However, the successful use of these organosilane solutions to aid in photoresist adhesion to silicon nitride requires very rigorous control measures during wafer processing to achieve consistent acceptable results. Such rigorous quality control is difficult to achieve in a high volume manufacturing environment in which consistent high yields at every step in the process are required to maximize overall net process yields and thereby minimize production costs of semiconductor devices.

SUMMARY OF THE INVENTION

The primary object of this invention is to provide a method for conditioning the surface of a nitride film on a semiconductor wafer in preparation for subsequent wafer processing steps.

A further object of this invention is to provide a method of selectively removing portions of a layer of silicon nitride from a semiconductor wafer which is characterized by reduced processing time and highly reliable and reproducible results in a high volume production environment.

These objects and other advantages are accomplished through the invention as described and claimed herein. The method of conditioning the nitride surface on a semiconductor wafer comprises the steps of positioning the wafer in a vacuum enclosure and treating the nitride surface with ionized oxygen for a period of time sufficient to condition the nitride surface for subsequent processing steps. The ionized oxygen surface treatment is performed starting at ambient temperature. Thus, the characteristics of the nitride layer and any underlying layers cannot be adversely affected as can sometimes occur in a high temperature masking oxide deposition process.

A feature of the invention is directed to the particular manner in which the ionized oxygen surface treatment step is effected. This treatment step includes the steps of introducing oxygen into the vacuum enclosure in which the semiconductor wafer is disposed, stabilizing the amount of oxygen in the enclosure and ionizing the oxygen to effect treatment of the surface of the silicon nitride on the wafer with ionized oxygen. A specific embodiment of the oxygen ionization step comprises generating a radio frequency field within the stabilized oxygen-containing enclosure.

Another feature of the invention is the use of the conditioning method as a part of a fabrication process of a semiconductor device wherein a layer of silicon nitride has been deposited on a substrate and only selected portions of the silicon nitride layer are to be removed. The surface of the silicon nitride layer is first treated with ionized oxygen. A liquid solution of an organosilane material, preferably a solution of hexaalkyldisilazane is then applied to the conditioned silicon nitride surface. The alkyl of the hexaalkyldisilazane is selected from the group consisting of methyl, ethyl and propyl. Subsequently, a layer of photoresist material is applied. The resultant photoresist layer is exposed through an appropriate photographic mask and developed to produce a photoresist etchant mask. This etchant mask will be sufficiently adherent during subsequent etching of the exposed portions of the silicon nitride layer to produce a sharply defined, closely controlled nitride layer topology when the etching is completed. Moreover, this method for removal of selected portions of a nitride layer requires no more rigorous quality control than the prior art method which employed a masking oxide layer and thus results in a time and cost saving with equivalent process yield.

The method in accordance with this invention is particularly advantageous when an oxide layer under the nitride layer must also be removed. With a photoresist mask directly on the conditioned nitride surface, a combined nitride-oxide etching solution can be employed to etch away both the nitride and oxide layers in one etching operation.

BRIEF DESCRIPTION OF THE DRAWINGS

Other objects, features, and advantages of this invention will appear in the following description and appended claims, reference being made to the accompanying drawings forming a part of the specification wherein like reference characters designate corresponding parts in the several views.

FIG. 2-6 visually depict the processing of a silicon semiconductor device incorporating the conditioning method of this invention.

DESCRIPTION OF THE PREFERRED EMBODIMENTS

Figure 1:
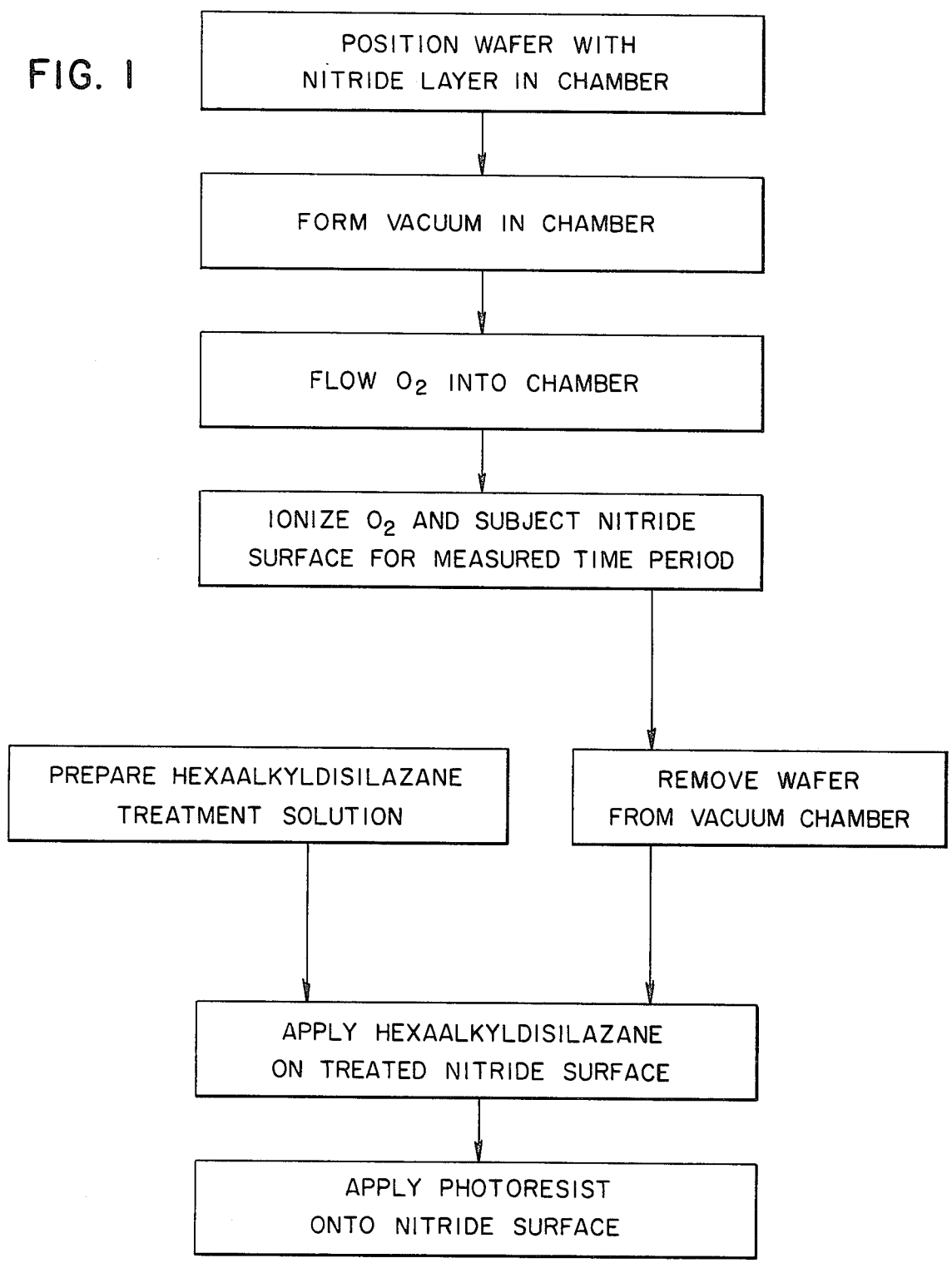
FIG. 1 is a flow diagram showing the sequence of processing steps in a specific embodiment of a method for forming a strongly adherent layer of photoresist on a layer of silicon nitride in accordance with this invention.

Referring to FIG. 1 of the drawings, the first step in the method of forming a photoresist layer on a silicon nitride layer in accordance with this invention is to position a semiconductor wafer with a nitride layer thereon in a vacuum chamber which is then evacuated to a pressure of about 1 mm of mercury. A commercial grade, dry oxygen is then allowed to flow into the chamber at room temperature until the pressure therein is stabilized at about 1.2 mm of mercury.

The wafer is kept in the vacuum chamber while the stabilized oxygen atmosphere therein is ionized to effect treatment of the nitride surface. In a specific embodiment of the invention, a radio frequency field is generated within the chamber to produce an ionized oxygen plasma to treat the nitride surface. Typically, the nitride layer is silicon nitride, and it has been found that the nitride surface is conveniently maintained in the ionized oxygen for a period of about 10 to 15 minutes. The low pressure oxygen atmosphere is maintained during the ionizing treatment step. Once the oxygen ionizing step is completed, atmospheric pressure is established in the chamber and the wafer is removed from the chamber. This completes an initial conditioning of the nitride surface for subsequent processing steps.

The oxygen ionizing step may be effected in a known oxygen plasma generating device generally referred to as a plasma stripper. A plasma stripper is normally used to remove and ash a photoresist mask from the surface of a semiconductor wafer after completion of an etching operation. Such a photoresist stripper is well-known and bears an identification as Model LTA-302 (manufactured by LFE Corp.). When used to condition a nitride surface of a semiconductor wafer with ionized oxygen, the stripper is operated in essentially the same mode as when stripping photoresist material. It has been discovered that both operations are mutually exclusive and appear to have no adverse affect on each other. Th radio frequency field generated to ionize the oxygen within the vacuum chamber during the oxygen ionizing step is maintained at a power setting of 250 watts. This is the setting designation found on the plasma stripper model referred to above.

After conditioning the nitride surface with ionized oxygen, the conditioned nitride surface is treated with a liquid organosilane solution, preferably a hexaalkyldisilazane wherein the alkyl group is selected from the group consisting of methyl, ethyl and propyl. In a specific embodiment, a liquid solution of hexamethyldisilazane includes one part, by volume, of reagent grade hexamethyldisilazane (HMDS) and one part, by volume, of xylene. The treatment solution is prepared at room temperature. The xylene is a semiconductor low mobile ion grade. While a 1:1 ratio of HMDS-xylene solution is used in this specific embodiment, satisfactory results may also be achieved with solutions ranging from equal volumes of HMDS-xylene to 100 percent HMDS.

The HMDS solution is deposited over the entire conditioned nitride surface of the semiconductor wafer. The solution may be dispensed on to the wafer, preferably while the wafer is stationary, through an eye dropper or a tube. The solution is then evenly distributed by spinning the wafer at about 3000 rpm for about 10–15 seconds at room temperature. Subsequently, a photoresist material is deposited directly on the treated nitride surface. The wafer is again spun at about 3000 rpm for about 20–30 seconds to produce the desired uniform photoresist thickness. The photoresist may then be normalized in a standard fashion by baking out in an inert atmosphere such as nitrogen for a period of about 20 minutes at about 90° C.±5° C. The photoresist layer on the wafer is then ready to be exposed through a photographic mask and developed in a well-known fashion. The resultant photoresist etchant mask is strongly adherent to the nitride surface during subsequent etching operations.

It is not precisely known why the combined oxygen plasma-HMDS treatment of the nitride surface produces such consistently good adherence of photoresist to silicon nitride. Possibly the oxygen plasma surface treatment converts a very thin layer of the nitride to an oxynitride which enhances the ability of the HMDS to improve the adherence of photoresist to the treated surface. In any event, it has been clearly demonstrated by experimentation that the use of oxygen plasma treatment alone or the use of HMDS alone produces inconsistent results while the combined use of both steps produces surprisingly consistent results.

The method of this invention described above with reference to a nitride surface generally will now be described in conjunction with a process for fabricating an MNOS device using the schematic cross-sectional representation shown in FIGS. 2 through 6. As shown in FIG. 2, during the processing of a semiconductor wafer to produce an MNOS device, layers of silicon dioxide 12 and silicon nitride 13 are formed over a p+ doped region 11 in an n-type silicon substrate. Since it is necessary to make electrical contact to the p+ region 11, portions of oxide layer 12 and nitride layer 13 which are electrically insulating must be removed so that a layer electrically conductive material such as aluminum can be formed on the wafer in contact with the p+ region.

The surface of silicon nitride layer is first conditioned with ionized oxygen plasma as previously described. This forms a thin conditioned nitride surface layer 13A (FIG. 3) to which HMDS 14 and photoresist 15 are sequentially applied in the manner previously described. Thereafter, a photographic mask with light transmissive regions 16B and an opaque region 16A is mounted on the wafer as shown in FIG. 4, and the photoresist is exposed to light through the transmissive regions 16B of photographic mask 16. Thereafter, when mask 16 is removed and photoresist 15 is developed, a photoresist etchant mask as shown in FIG. 5 results. The wafer is then immersed in a wet chemical etchant, such as buffered hydrofluoric acid, which attacks conditioned nitride layer 13A, nitride layer 13, and oxide layer 12, but not photoresist layer 15, so that the wafer topology shown in FIG. 6 results after the photoresist is stripped from the wafer. The wafer is then ready for aluminizing and further processing steps.

While the method for conditioning nitride surfaces has been shown and described in detail, it is obvious that this invention is not to be considered as being limited to the exact form disclosed, and that changes in detail and construction may be made therein within the scope of the invention, without departing from the spirit thereof.

We claim:

1. A method for treating the surface of a silicon nitride layer formed on a semiconductor wafer to enhance the adhesion of photoresist to the surface during etching in buffered hydrofluoric acid, comprising in sequence of steps of:

exposing the surface of the silicon nitride layer to an ionized oxygen plasma for at least about 10 minutes; and applying to the nitride surface a liquid solution of hexalkyldisilazane wherein the alkyl group is selected from methyl, ethyl and propyl.

2. The method as recited in claim 1 wherein the steps of exposing the surface of the nitride layer to an oxygen plasma comprises the steps of:

subjecting the wafer to a flow of oxygen stabilized at a pressure of about 1.2 mm. of mercury; and bombarding the oxygen with a radio frequency field of about 250 watts energy to produce an ionized oxygen plasma.

3. The method of claim 1 or 2 wherein the step of applying a liquid solution of hexalkyldisilazane to the surface of the nitride layer comprises:

applying to the surface of the nitride layer a solution of hexalkyldisilazane and xylene comprising at least fifty percent by volume hexalkyldisilazane; and spinning the wafer to distribute the solution over the surface.

* * * * *